United States Patent
Kashiwaya et al.

(10) Patent No.: US 6,610,427 B2
(45) Date of Patent: Aug. 26, 2003

(54) PIEZOELECTRIC ELEMENT AND PROCESS FOR PRODUCTION THEREOF

(75) Inventors: Toshikatsu Kashiwaya, Inazawa (JP); Mutsumi Kitagawa, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/072,294

(22) Filed: Feb. 7, 2002

(65) Prior Publication Data

US 2003/0072972 A1 Apr. 17, 2003

Related U.S. Application Data

(63) Continuation-in-part of application No. 09/953,674, filed on Sep. 17, 2001.

(30) Foreign Application Priority Data

Sep. 20, 2000 (JP) .......................................... 2000-286115
Dec. 20, 2001 (JP) .......................................... 2001-388315

(51) Int. Cl.⁷ .............................. B32B 9/00; H01L 4/08
(52) U.S. Cl. ..................... 428/701; 428/688; 428/689; 428/699; 428/701; 428/702; 252/62.9 R; 252/62.9 PZ; 501/134; 501/135; 501/136; 310/311
(58) Field of Search .................... 310/328, 311; 501/134, 135, 136; 252/62.9 R, 62.9 PZ; 428/688, 689, 699, 701, 702

(56) References Cited

U.S. PATENT DOCUMENTS 5,376,857 A * 12/1994 Takeuchu et al. ........... 310/328

FOREIGN PATENT DOCUMENTS

| JP | 42-20029 | 10/1967 |
| JP | 50-3519 | 2/1975 |
| JP | 60102779 A | 6/1985 |
| JP | 07315926 A | 12/1995 |
| JP | 11029357 A | 2/1999 |

OTHER PUBLICATIONS

Ouchi, Hiromu, et al. *Piezoelectric Properties of Pb(Mg$_{1/3}$ Nb$_{2/3}$)O$_3$–PbTiO$_3$–PbZrO$_3$ Ceramics Modified with Certain Additives*, Journal of the American Ceramic Society, Nov. 21, 1966, vol. 49, No. 11, 577–582.

* cited by examiner

Primary Examiner—Deborah Jones
Assistant Examiner—Ling Xu
(74) Attorney, Agent, or Firm—Burr & Brown

(57) ABSTRACT

A piezoelectric element includes: a ceramic substrate, an electrode and a piezoelectric portion made of a piezoelectric ceramic composition containing a Pb(Mg, Ni)$_{1/3}$Nb$_{2/3}$O$_3$—PbZrO$_3$—PbTiO$_3$ ternary system solid solution composition being represented by the following general formula (1) as a main component: Pb$_x${(Mg$_{1-y}$Ni$_y$)$_{1/3xa}$Nb$_{2/3}$}$_b$Ti$_c$Zr$_d$O$_3$(1), wherein $0.95 \leq x \leq 1.05$; $0.05 \leq y \leq 0.20$; $0.90 \leq a \leq 1.10$; b,c, and d are decimals falling in a range surrounded by (b, c, d)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200) in the coordinates with coordinate axes of said b, c and d, and b+c+d=1.000. The electrode is electrically connected to the piezoelectric portion, and the piezoelectric portion is solidly attached to the ceramic substrate directly or via the electrode.

28 Claims, 6 Drawing Sheets

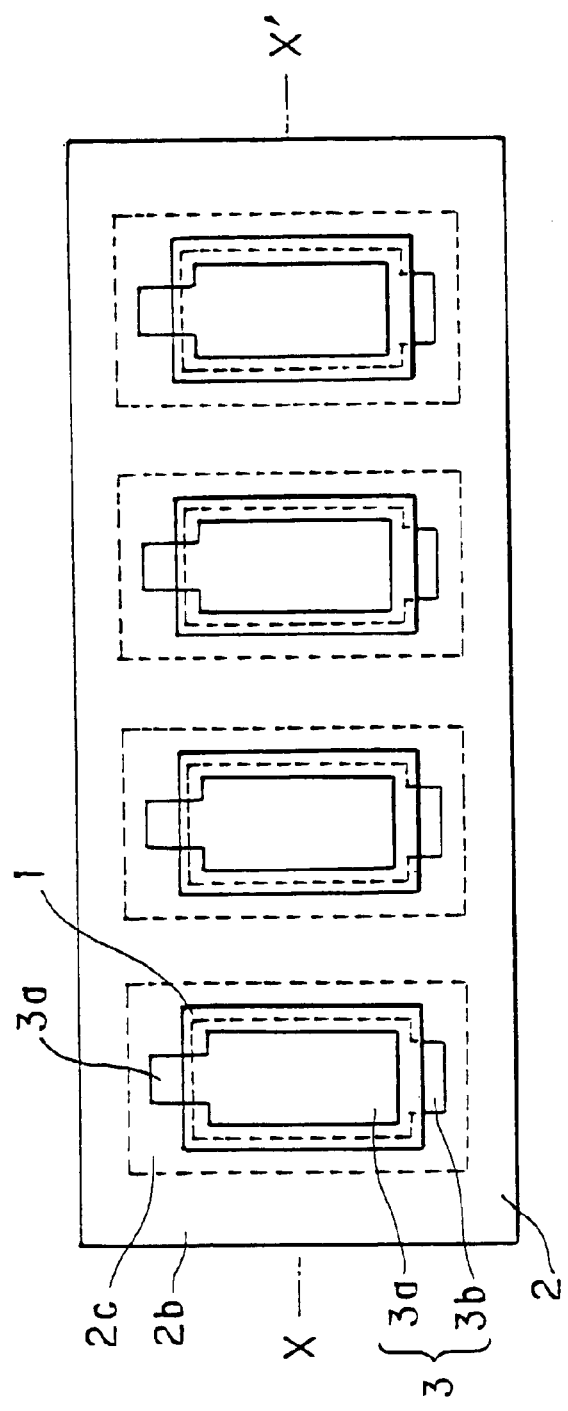
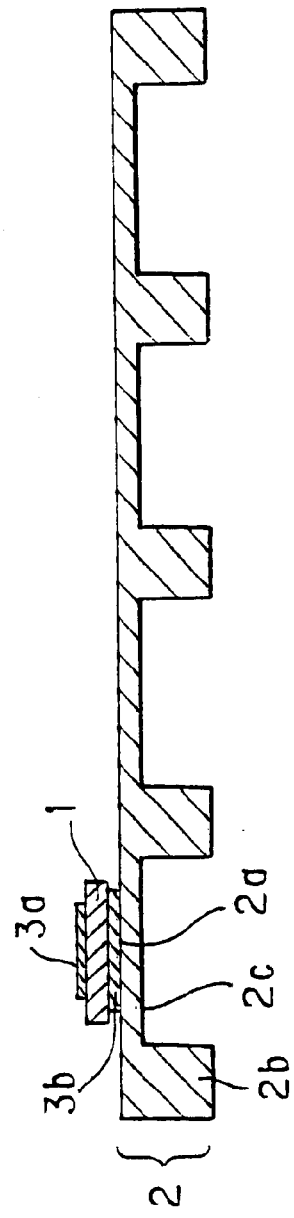
FIG. 3(a)
FIG. 3(b)

PIEZOELECTRIC ELEMENT AND PROCESS FOR PRODUCTION THEREOF

CROSS-REFERENCE OF RELATED APPLICATION

This application is a continuation-in-part application of U.S. application Ser. No. 09/953,674 filed Sep. 17, 2001, the entirety of which is incorporated herein by reference. This application also claims the benefit of Japanese Application 2000-286,115, filed Sep. 20, 2000, and Japanese Application 2001-388,315, filed Dec. 20, 2001, the entireties of which are incorporated herein by reference.

BACKGROUND OF INVENTION AND RELATED ART

The present invention relates to a piezoelectric element. More particularly, the present invention relates to a piezoelectric portion which has very high piezoelectric properties, and which has a high rate of increase of displacement as an actuator in the case of applying a large electric field and a high decomposability as a sensor in the case that a great force is applied.

In recent years, piezoelectric elements have been used in ink jet printer heads, speakers, microphones, etc.

As the piezoelectric elements, there are generally known those comprising a ceramic substrate, a piezoelectric portion made of a piezoelectric ceramic composition, formed on the substrate, and electrodes electrically connected to the piezoelectric portion. As to the piezoelectric ceramic composition constituting the piezoelectric portion, various improved compositions have been disclosed.

For example, a $Pb(Mg_{1/3}Nb_{2/3})O_3$—$PbTiO_3$—$PbZrO_3$ ternary system solid solution composition and a piezoelectric ceramic composition wherein part of Pb in the above composition is replaced by Sr, La, etc., were disclosed [Japanese Patent Publication S44-17103, Japanese Patent Publication S45-8145]. These compositions are improved in piezoelectric properties (e.g. piezoelectric d constant) which are the most important factor determining the piezoelectric element properties, and a piezoelectric element having superior piezoelectric properties is expectable.

When a piezoelectric element is produced actually by superposing a piezoelectric material made of the above piezoelectric ceramic composition on a ceramic substrate and then subjecting the piezoelectric material to heat treatment, the obtained piezoelectric portion has a low density, and therefore, there have been pointed out such a problem that the piezoelectric element has a low flexural displacement or, when a voltage is applied thereto, it causes dielectric breakdown at the low density area. In particular, this problem is remarkable in the case of a piezoelectric element having a layered structure that a negative electrode and a positive electrode are interposed between piezoelectric portions alternatively, and its improvement has been strongly demanded.

In addition, sufficient piezoelectric properties cannot always be obtained with a piezoelectric portion made of the aforementioned piezoelectric ceramic composition, and there have been such a problem that when a voltage is raised to increase a flexural displacement, an increase of the flexural displacement obtained is very small relative to an increase of voltage on a side of a high electric field of 4 kV/mm or more.

Further, durability of the piezoelectric element is not sufficient when it is used for a long time under such a condition that a large flexural displacement is caused, thereby causing breakage of a piezoelectric portion and exfoliation between a piezoelectric portion and the substrate or an electrode.

Hence, there has been proposed a piezoelectric element produced by previously heat-treating a piezoelectric material made of the above piezoelectric ceramic composition to produce a piezoelectric portion, and then attaching this piezoelectric portion onto a ceramic substrate (Japanese Patent Application H11-29357).

In this piezoelectric element, attention was paid to a fact that use of a ceramic substrate impairs the densification of a piezoelectric portion, and this piezoelectric element was accordingly improved in piezoelectric properties by means of obtaining a dense piezoelectric portion where a piezoelectric material made of a piezoelectric ceramic composition was previously heat-treated.

In this piezoelectric element, however, it is necessary to use an inorganic or organic adhesive at the time of attaching the piezoelectric onto the ceramic substrate; therefore, there have been such problems that the adhesive impairs the vibration transmittability between the ceramic substrate and the piezoelectric or the adhesive components infiltrate into the piezoelectric or the ceramic substrate, deteriorating their properties.

In addition, in this piezoelectric element, no consideration is given to a piezoelectric ceramic composition itself constituting a piezoelectric portion. Therefore, there has been a problem that sufficient piezoelectric properties cannot always be obtained like the aforementioned piezoelectric element, that an increase of the flexural displacement obtained is very small relative to an increase of voltage in a region of a high electric field, and further that it has insufficient durability.

SUMMARY OF THE INVENTION

The present invention has been completed in view of the aforementioned problems and aims at providing a piezoelectric element which has very high piezoelectric properties, which is excellent in vibration transmittability between a substrate and a piezoelectric portion, where linearity of a flexural displacement to voltage is ensured till a high electric region, and which has high durability even in use with a large flexural displacement for a long period of time and a method for production thereof.

The present inventor made a study in order to solve the aforementioned problems. As a result, the present inventor found out that when there is used a piezoelectric material made of a piezoelectric ceramic composition having a specific composition of a $PbMg_{1/3}Nb_{2/3}O_3$—$PbZrO_3$—$PbTiO_3$ ternary system solid solution composition with a part of Mg being substituted by Ni, the densified piezoelectric portion having an even polarization structure can be obtained even when a piezoelectric material is superposed on a substrate and then heat-treated, whereby the aforementioned problems can be solved. The present invention has been completed based on the above finding.

That is, according to the present invention, there is provided a piezoelectric element comprising;

a ceramic substrate, a piezoelectric portion made of a piezoelectric ceramic composition containing a $Pb(Mg, Ni)_{1/3}Nb_{2/3}O_3$—$PbZrO_3$—$PbTiO_3$ ternary system solid solution composition being represented by the following general formula (1) as a main component, and an electrode;
wherein said electrode is electrically connected to said piezoelectric portion, and said piezoelectric portion is solidly attached to the ceramic substrate directly or via said electrode:

$$Pb_x\{(Mg_{1-y}Ni_y)_{1/3\times a}Nb_{2/3}\}_b Ti_c Zr_d O_3 \qquad (1)$$

wherein $0.95 \leq x \leq 1.05$; $0.05 \leq y \leq 0.20$; $0.90 \leq a \leq 1.10$; b, c and d are decimals falling in a range surrounded by (b,c,d)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200) in the coordinates with coordinate axes of said b, c and d, and b+c+d=1.000.

According to the present invention, there is further provided a piezoelectric element comprising:
a ceramic substrate,
a plurality of piezoelectric portion made of a piezoelectric ceramic composition containing a $Pb(Mg, Ni)_{1/3}Nb_{2/3}O_3$—$PbZrO_3$—$PbTiO_3$ ternary system solid solution composition represented by the above general formula (1) as a main component, and
a plurality of electrodes;
wherein said plurality of piezoelectric portions are laminated with interposing negative electrodes and positive electrodes of said electrodes alternately in each gap between said piezoelectric portions and a lowermost piezoelectric portion is solidly attached to the ceramic substrate directly or via said electrode.

In any of the piezoelectric elements of the present invention, it is preferable that the ternary system solid solution composition has an average particle diameter of 1–10 µm with a maximum particle diameter being 5 times as large as the average particle diameter or less.

According to the present invention, there is further provided a piezoelectric element comprising:
a ceramic substrate,
a piezoelectric portion made of a piezoelectric ceramic composition containing a $Pb(Mg, Ni)_{1/3}Nb_{2/3}O_3$—$PbZrO_3$—$PbTiO_3$ ternary system solid solution composition represented by the aforementioned general formula (1) as a main component, and said piezoelectric ceramic composition contain particles having NiO as a main component on the surface and/or in the interior thereof, and
an electrode;
wherein said electrode is electrically connected to said piezoelectric portion, and said piezoelectric portion is solidly attached to the ceramic substrate directly or via said electrode.

Also, in a piezoelectric element where this NiO particle is present, it is preferable that a ternary system solid solution composition has an average particle diameter or of 1–10 µm with the maximum particle diameter being 5 times as large as the average particle diameter or less. In addition, a particle having NiO as the main component may include only NiO or a solid solution of NiO and MgO.

In any of piezoelectric elements of the present invention, it is preferable that Ni is dispersed in the piezoelectric ceramic composition in such a concentration gradient that the concentration of Ni becomes higher from the interface between the piezoelectric portion and the substrate towards the thickness direction of the piezoelectric portion.

Pb in the piezoelectric ceramic composition may be replaced by at least one kind of element selected from the group consisting of Sr, Ca and Ba, by 2 to 10 mole %. Pb in the piezoelectric ceramic composition may also be replaced by La by 0.2 to 1.0 mole %.

It is preferable that the ceramic substrate has a thickness of 3 µm to 1 mm, that the piezoelectric portion has a thickness of 1 to 300 µm, that the ratio of the thickness of the substrate to the thickness of the piezoelectric portion (the thickness of the ceramic substrate/the thickness of the piezoelectric portion) is 0.1 to 30, and that a cross-section of the ceramic substrate in the thickness direction has a W-like shape having three inflection points.

According to the present invention, there is further provided a method for producing a piezoelectric element comprising the steps of:
superposing a piezoelectric material containing a $Pb(Mg, Ni)_{1/3}Nb_{2/3}O_3$—$PbZrO_3$—$PbTiO_3$ ternary system solid solution composition represented by the following general formula (1) as a main component and on a ceramic substrate or on an electrode formed on the ceramic substrate, and
subjecting the superposed piezoelectric material to a thermal treatment in an atmosphere where 0.03–0.5 mg/cm³ (NiO conversion amount per unit volume of a space in a container) of a atmosphere-controlling material having the same composition as the piezoelectric material is coexisted:

$$Pb_x\{(Mg_{1-y}Ni_y)_{1/3}Nb_{2/3}\}_b Ti_c Zr_d O_3 \qquad (1)$$

wherein $0.95 \leq x \leq 1.05$; $0.05 \leq y 0.20$; $0.90 \leq a \leq 1.10$; b, c and d are decimals falling in a range surrounded by (b,c,d)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200), in the coordinates with coordinate axes of said b, c and d, and b+c+d=1.000.

According to the present invention, there is further provided a method for producing a piezoelectric element comprising the steps of:
superposing a piezoelectric material containing a $Pb(Mg, Ni)_{1/3}Nb_{2/3}O_3$—$PbZrO_3$—$PbTiO_3$ ternary system solid solution composition represented by the aforementioned general formula (1) as a main component on a ceramic substrate or on an electrode formed on the ceramic substrate, and
subjecting the superposed piezoelectric material to a thermal treatment in an atmosphere;
wherein a previously heat-treated container and a previously heat-treated setter is used as a container for housing said electrode on which the piezoelectric material is superposed and a setter for mounting the piezoelectric material thereon in the presence of 0.03–0.5 mg/cm³ (NiO conversion amount per unit volume of a space in a container) of an atmosphere-controlling material having the same composition as the piezoelectric material.

The piezoelectric element according to the present invention can be used for condensers or various sensors, as a dense and small dielectric element or pyroelectric element.

BRIEF DESCRIPTION OF THE DRAWINGS

FIG. 1(a) is a plan view, and FIG. 1(b) is a sectional view taken along the X–X' line of FIG. 1(a).

FIG. 2(a) is a plan view, and FIG. 2(b) is a sectional view taken along the X–X' line of FIG. 2(a).

FIGS. 3(a) and 3(b) are explanatory views schematically showing still another embodiment of the piezoelectric element of the present invention. FIG. 3(a) is a plan view, and FIG. 3(b) is a sectional view taken along the X–X' line of FIG. 3(a).

FIG. 4(a) is a plan view, and FIG. 4(b) is a sectional view taken along the X–X' line of FIG. 4(a).

FIG. 5(a) is a plan view, and FIG. 5(b) is a sectional view taken along the X–X' line of FIG. 5(a).

DESCRIPTION OF PREFERRED EMBODIMENTS

Figure 1A:
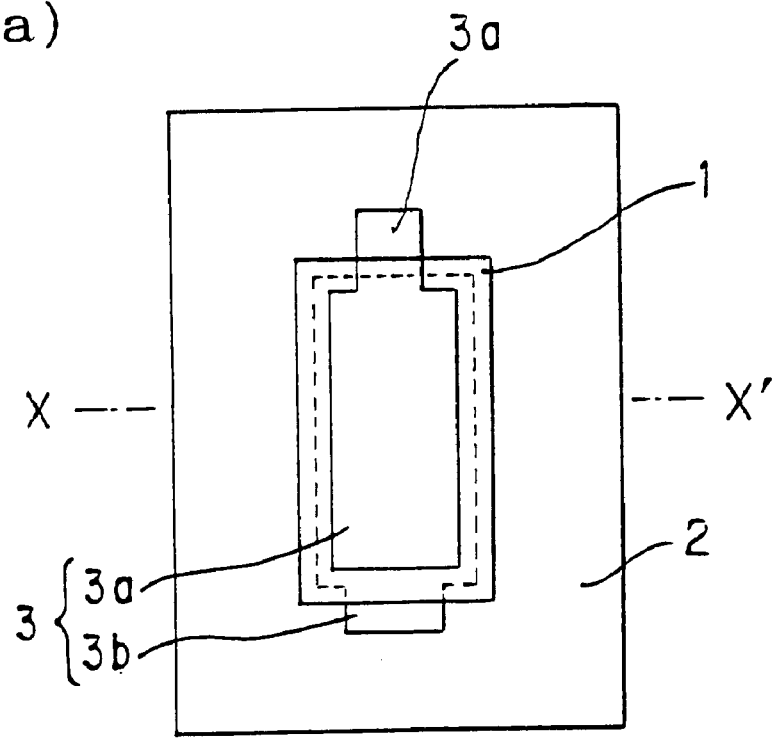
FIGS. 1(a) and 1(b) are explanatory views schematically showing an embodiment of the piezoelectric element of the present invention.
Figure 1B:
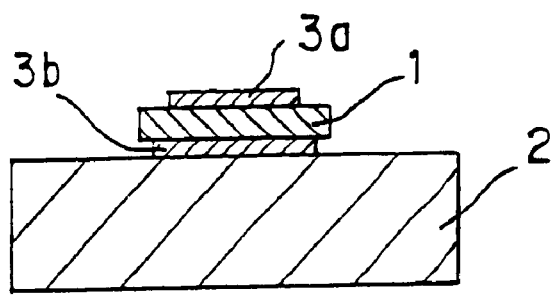

Embodiments of the present invention is described below with referring to the drawings.

As shown in FIGS. 1(a)(b), the piezoelectric element of the present invention is provided with: a ceramic substrate 2, a piezoelectric portion 1 composed of a specific piezoelectric ceramic composition, and electrodes 3 (3a and 3b). The electrodes 3 (3a and 3b) are electrically connected to the piezoelectric portion 1, and the piezoelectric portion 1 is solidly attached to the ceramic substrate 2 directly or via the electrodes 3.

The present piezoelectric element is described specifically below at every constituent.

The substrate 2 used in the present invention is of ceramics and preferably made of a material containing at least one kind selected from the group consisting of stabilized zirconium oxide, aluminum oxide, magnesium oxide, mullite, aluminum nitride, silicon nitride and glass, for the heat resistance, chemical stability and insulating property. Of these, particularly preferred is a material containing stabilized zirconium oxide, for the high mechanical strength and excellent tenacity.

The substrate 2 has a thickness of preferably 3 μm to 1 mm, more preferably 5 to 500 μm, particularly preferably 7 to 200 μm in the present invention.

When the thickness of the substrate 2 is less than 3 μm, the piezoelectric element may have a low mechanical strength; and when the thickness is more than 1 mm, the rigidity of the substrate relative to the shrinkage stress of the piezoelectric portion is large when a voltage is applied to the piezoelectric element, and the piezoelectric element may show a small flexural displacement.

Figure 2A:
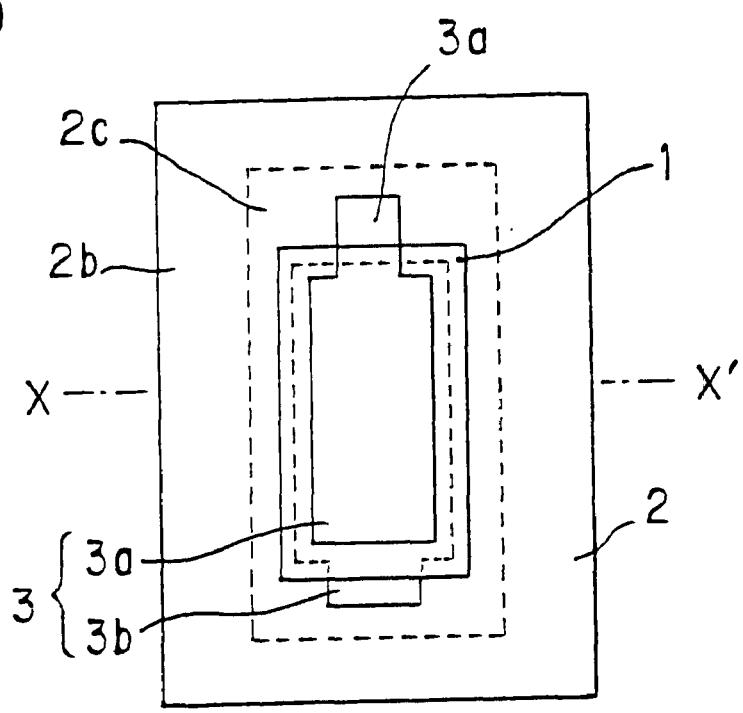
FIGS. 2(a) and 2(b) are explanatory views schematically showing another embodiment of the piezoelectric element of the present invention.
Figure 2B:
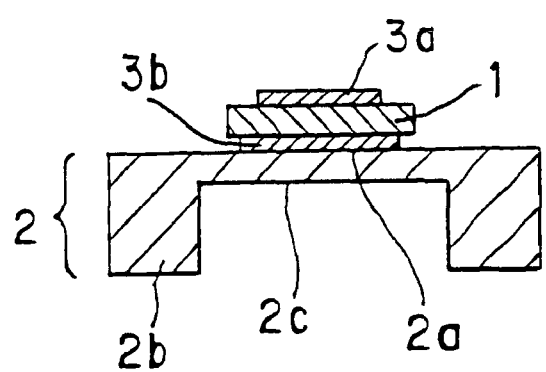

The substrate 2 may be produced so as to have, as shown in FIGS. 2(a) and 2(b), a thin portion 2c roughly corresponding to an interface 2a between piezoelectric portion 1 or electrode 3b and ceramic substrate 2 and having the aforementioned thickness and a thick portion 2b roughly corresponding to the surface area of ceramic substrate other than the interface 2a and having a larger thickness than the thin portion 2c.

Thereby, the piezoelectric element obtained can show a larger flexural displacement and a higher mechanical strength.

It is also possible that a plurality of units each having such a structure are provided on a single substrate 2, as shown in FIGS. 3(a) and 3(b).

There is no particular restriction as to the surface shape of the substrate 2 in the present invention. The surface shape may be, for example, a rectangle, a square, a triangle, an ellipse, a true circle, an edge-rounded square, an edge-rounded rectangle, a capsule or a combination thereof.

A cross-section of the substrate 2 in the thickness direction has a W-like shape having three inflection points in view of high linearity of a flexural displacement relative to an electric field.

The piezoelectric portion 1 used in the present invention is a $Pb(Mg, Ni)_{1/3}Nb_{2/3}O_3$—$PbZrO_3$—$PbTiO_3$ ternary system solid solution composition and made of a piezoelectric ceramic composition represented by the following general formula (1):

$$Pb_x\{(Mg_{1-y}Ni_y)_{1/3 \times a}Nb_{2/3}\}_b Ti_c Zr_d O_3 \qquad (1)$$

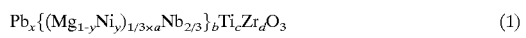

wherein $0.95 \leq x \leq 1.05$; $0.05 \leq y < 0.20$; $0.90 \leq a \leq 1.10$; b, c and d are decimals falling in a range surrounded by (b,c,d)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200) in the coordinates with coordinate axes of said b, c and d, and b+c+d=1.000.

This enables to give a dense piezoelectric element having an even polarization structure, and thereby increase in flexural displacement of a piezoelectric element, improvement in linearity of a flexural displacement relative to an electric field.

The reason why, in the above general formula (1), a, b and c are made to be within the aforementioned specific range, is that, a, b and c being without the range cause deterioration in flexural displacement of the piezoelectric element, linearity of a flexural displacement relative to an electric field, and durability. Likewise, the reason why the y (a substitution rate of Ni to Mg) in the above general formula (1) is within the range of 0.05 to 0.20 is that the y of less than 0.05 causes insufficient densification, thereby causing deterioration in flexural displacement of the piezoelectric element and increase of rate of short and dielectric breakdown. On the other hand, when the y exceeds 0.20, there is caused deterioration in linearity of a flexural displacement relative to an electric field and durability in a piezoelectric portion 1

Therefore, in the present invention, y in the above general formula (1) is preferably 0.08–0.18, and more preferably 0.10–0.15.

In the present invention, Ni is preferably dispersed in the piezoelectric ceramic composition uniformly and more preferably in such a concentration gradient that the concentration of Ni becomes higher from the interface 2a between the piezoelectric portion and the substrate towards the thickness direction of the piezoelectric portion.

Thereby, the piezoelectric portion 1 can have a higher density even in the case that it is solidly attached to the substrate 2 directly or via an electrode.

In the present invention, it is preferable that at least a part of NiO in this piezoelectric ceramic composition is present as a particle having NiO as the main component.

The presence of such NiO particles enables to secure linearity of a flexural displacement relative to an electric field up to a high electric field region, and thereby a larger flexural displacement can be obtained in comparison with a conventional piezoelectric element with the same electric force.

In the present invention, particles having NiO as the main component are preferably present on the surface and/or in the interior of the piezoelectric ceramic composition in the point that linearity of a flexural displacement relative to an electric field can be ensured up to a higher electric field region, more preferably unevenly distributed on the surface of the piezoelectric ceramic composition.

Here, "unevenly distributed" means "present in a part unevenly and includes both "present more on a surface than in the interior though they are present on the surface and in the interior of a piezoelectric ceramic composition" and "present only on the surface."

In the present invention, there is no particular limitation on a particle diameter of particles having NiO as the main component. However, it is preferably 0.1–2 $\mu$m. In addition, particles having NiO as the main component may be of only NiO or of MgO of solid solution. However, the particles of MgO of solid solution is preferable in view of high linearity of a flexural displacement.

In the present invention, it is preferred to replace the Pb in the piezoelectric ceramic composition by at least one kind of element selected from the group consisting of Sr, Ca, Ba and La for improvement in piezoelectric properties and linearity of a flexural displacement relative to the amount of an electric field.

However, replacement of Pb in the piezoelectric ceramic composition with a high rate causes deterioration in a flexural displacement, increase in influence of a flexural displacement on a temperature change, and deterioration in linearity of an amount of a flexural displacement. Therefore, the rate of replacement is preferably within a suitable range at every substituent element.

When the Pb in the piezoelectric ceramic composition is replaced by at least one kind of element selected from the group consisting of Sr, Ca and Ba, the Pb is replaced preferably by 2 to 10 mole %, more preferably 4 to 8 mole %. When the Pb in the piezoelectric ceramic composition is replaced by La, the Pb is replaced preferably by 0.2 to 1.0 mole %, more preferably 0.4 to 0.9 mole %.

A piezoelectric ceramic composition in the present invention preferably has an average particle diameter of 1–10 $\mu$m with a maximum particle diameter being 5 times as large as the average particle diameter or less, more preferably an average particle diameter of 2–5 $\mu$m with a maximum particle diameter being 4 times as large as the average particle diameter or less, furthermore preferably an average particle diameter of 2–5 $\mu$m with a maximum particle diameter being 3 times as large as the average particle diameter or less.

When the average particle diameter is less than 1 $\mu$m, the domain in the piezoelectric portion does not develop sufficiently, which is prone to cause deterioration in flexural displacement and linearity of a flexural displacement relative to an electric field in a high electric field region. When the average particle diameter is more than 10 $\mu$m, the domain in the piezoelectric portion is large but does not move easily, which is prone to result in a small flexural displacement.

In addition, when the maximum particle diameter exceeds 5 times the length of the average particle diameter, coarse particles which polarization does not move easily increase, and thereby linearity of a flexural displacement relative to an electric field is prone to become low, and a flexural displacement itself is prone to become small.

The piezoelectric ceramic composition contains a phase other than perovskite phase preferably by 20% by volume or less, more preferably by 10% by volume or less.

The piezoelectric ceramic composition has a porosity of preferably 10% by volume or less, more preferably 5% by volume or less for ensuring a desired flexural displacement and mechanical strength and enhancing linearity of a flexural displacement relative to an electric field in a high electric field region.

The piezoelectric portion 1 in the present invention has a thickness of preferably 1 to 300 $\mu$m, more preferably 3 to 100 $\mu$m, particularly preferably 5 to 30 $\mu$m.

When the thickness of the piezoelectric portion 1 is less than 1 $\mu$m, even the piezoelectric portion made of the aforementioned specific piezoelectric ceramic composition is liable to be densified insufficiently. When the thickness is more than 300 $\mu$m, the stress to the substrate becomes relatively too large; in order to prevent the substrate fracture, the ceramic substrate needs to have a larger thickness, making it difficult to produce a small piezoelectric element.

The ratio of the thickness of the ceramic substrate 2 to the thickness of the piezoelectric portion 1 (the thickness of the ceramic substrate/the thickness of the piezoelectric portion) is preferably 0.1 to 30, more preferably 0.3 to 10, particularly preferably 0.5 to 5 from the point of ensuring mechanical strength and a desired flexural displacement.

In the present invention, any electrode 3 may be employed as long as it is electrically connected to the piezoelectric portion 1.

Figure 4A:
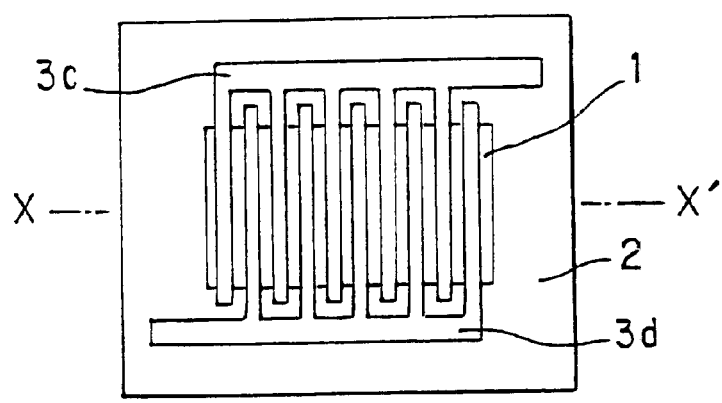
FIGS. 4(a) and 4(b) are explanatory views schematically showing still another embodiment of the piezoelectric element of the present invention.
Figure 4B:
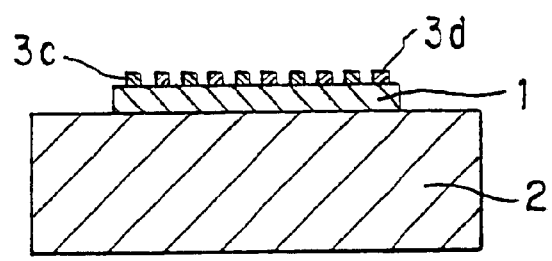
Figure 5A:
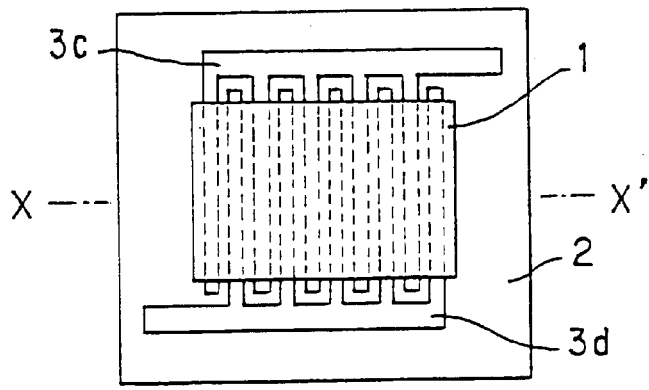
FIGS. 5(a) and 5(b) are explanatory views schematically showing still another embodiment of the piezoelectric element of the present invention.
Figure 5B:
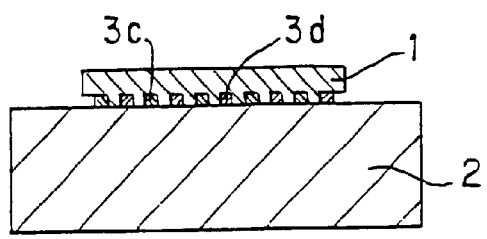

The electrodes 3 may be, for example, a pair of comb-shaped electrodes 3c and 3d formed on a piezoelectric portion 1 attached solidly to a substrate 2 as shown in FIGS. 4(a) and 4(b); or, may be a pair of comb-shaped electrodes 3c and 3d attached solidly to a substrate 2 with a piezoelectric portion 1 being solidly attached onto the electrodes 3c and 3d as shown in FIGS. 5(a) and 5(b).

Figure 6:
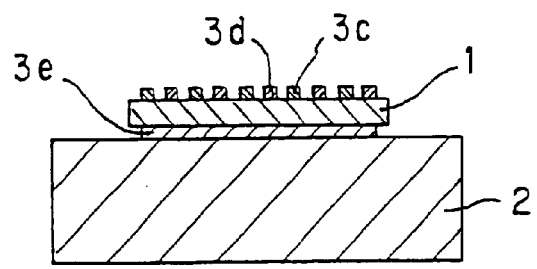
FIG. 6 is a sectional view schematically showing still another embodiment of the piezoelectric element of the present invention.
Figure 7:
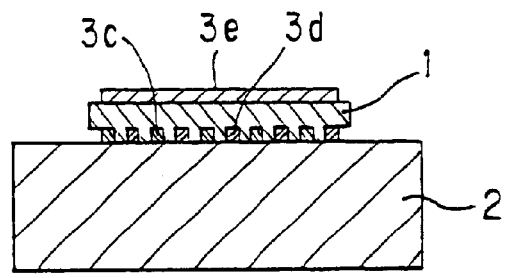
FIG. 7 is a sectional view schematically showing still another embodiment of the piezoelectric element of the present invention.

Alternatively, it is possible that, as shown in FIG. 6, on a pair of comb-shaped electrodes 3c and 3d solidly attached onto a substrate 2, a piezoelectric portion 1 is solidly attached, and a common electrode 3e is formed on a surface opposite to the surface of the piezoelectric portion 1 where the comb-shaped electrodes 3c and 3d are solidly attached. Conversely, it is also possible that, as shown in FIG. 7, on a common electrode 3e solidly attached onto a substrate 2, a piezoelectric portion 1 is solidly attached, and a pair of comb-shaped electrodes 3c and 3d are formed on a surface opposite to the surface of the piezoelectric portion 1 where the common electrode 3e is solidly attached.

Figure 8:
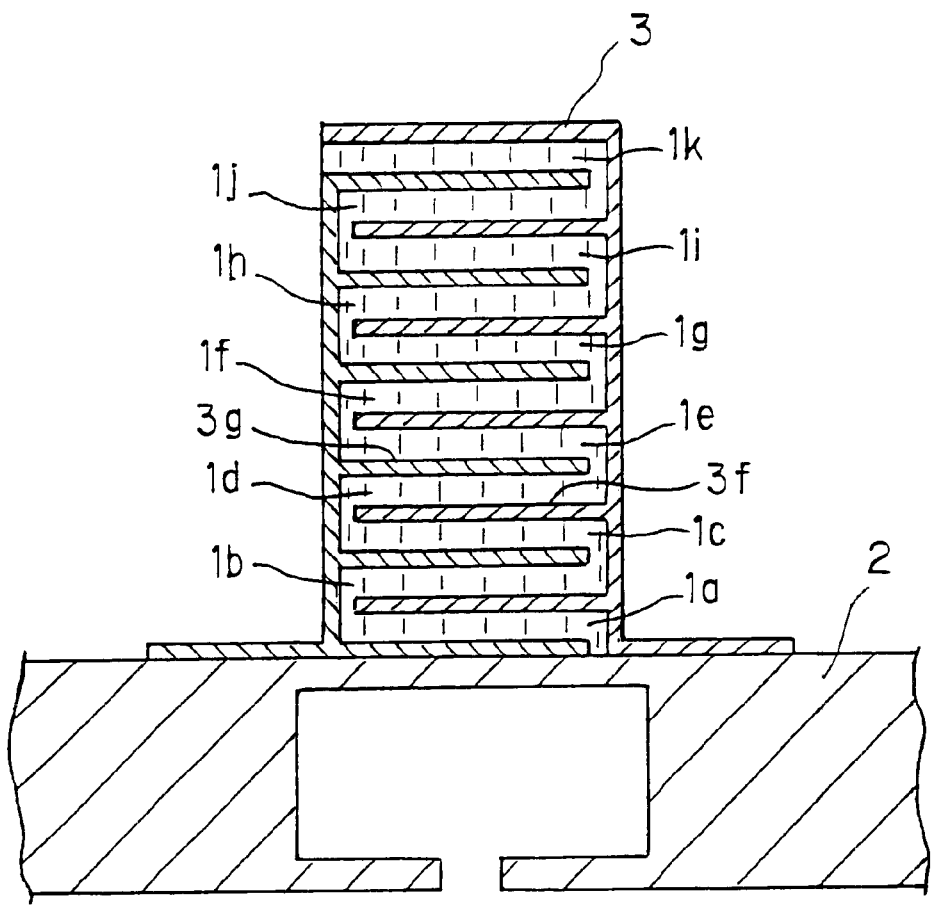
FIG. 8 is a sectional view schematically showing still another embodiment of the piezoelectric element of the present invention.

Further, a layered piezoelectric element, where a plurality of piezoelectric portions (1a–1k) are arranged in stories as shown in FIG. 8, preferably has a negative electrode 3f and a positive electrode 3g of the electrode 3 are alternatively interposed between the electrode portions (1a–1k).

At this time, a width of an electrode is preferably 60–90% of a width of a piezoelectric portion, and more preferably 70–80%.

When a width of an electrode is less than 60% of a width of a piezoelectric portion, a flexural displacement becomes small because an area of the piezoelectric portion where an electric field is applied is small. When a width of an electrode is more than 90% of a width of a piezoelectric portion, positioning of the electrode requires precision, and bad precision upon positioning causes a short between electrodes or dielectric breakdown.

As the material for the electrodes 3, there is no limitation and may be employed, for example, a material made of at least one kind selected from the group consisting of platinum, palladium, rhodium, gold, silver and alloys thereof. A glass component may be added thereto further upon the heat treatment described below to make formation of an electrode easy. Of these materials, platinum or an alloy composed mainly of platinum is preferred because they show high heat resistance during the heat-treatment of piezoelectric portion. In the case of the aforementioned layered piezoelectric element, a material for each electrode may be the same among all electrodes or different in a part of or all the electrodes.

The thickness of electrodes 3 in the present invention is preferably 15 μm or less, more preferably 5 μm or less because, when the thickness is more than 15 μm, the electrodes 3 act as a relaxing layer, which may result in a small flexural displacement.

Next, in the piezoelectric element of the present invention, each of the aforementioned elements for constituting the piezoelectric element is in a specific state, that is, the piezoelectric portion 1 is solidly attached to the substrate 2 directly or via the aforementioned electrode.

Thereby, it is possible to prevent the reduction in vibration transmittability between ceramic substrate 2 and piezoelectric portion 1, caused by the interposition of adhesive or the like, and the deterioration in piezoelectric properties due to deterioration in properties of piezoelectric portion 1 and ceramic substrate 2 caused by the infiltration of adhesive components or the like.

Herein, "be solidly attached" refers to that the piezoelectric portion is tightly integrated with the ceramic substrate directly or via the electrode, owing to a solid-state reaction between the ceramic substrate and the piezoelectric portion or the electrode, without using any organic or inorganic adhesive.

Incidentally, in a layered piezoelectric element shown in FIG. 8, the piezoelectric portion 1a at the lowest portion is solidly attached to the substrate 2 directly or via the electrode 3g.

In a piezoelectric element of the present invention, the ratio of the capacity after polarization to the capacity before polarization is preferably 120% or more, more preferably 125% or more, in the point of an easily movable polarization structure.

Then, a method for producing a piezoelectric element of the present invention is described.

In the production process of the present invention, first, a piezoelectric material made of a specific piezoelectric ceramic composition is superposed on a ceramic substrate or an electrode formed on a ceramic substrate.

The substrate used in the present invention can be produced by producing a compact having a desired shape by a general method of, for example, a press and an extrusion with using a material corresponding with the ceramics as described with respect to the piezoelectric element of the present invention and firing the compact under general firing conditions.

The piezoelectric material used in the present invention is made of a piezoelectric ceramic composition described with respect to the piezoelectric element of the present invention and can be prepared as follows.

That is, first, a mixture is prepared by mixing simple substances (elements) each consisting of Pb, Ba, Ca, Sr, La, Mg, Ni, Nb, Zr or Ti; oxides of these elements (e.g. PbO, $Pb_3O_4$, $La_2O_3$, MgO, NiO, $Nb_2O_5$, $TiO_2$ and $ZrO_2$); carbonates of these elements (e.g. $BaCO_3$, $SrCO_3$, $MgCO_3$ and $CaCO_3$); and compounds containing a plurality of these elements (e.g. $MgNb_2O$) so that the contents of elements (Pb, Ba, Ca, Sr, La, Mg, Ni, Nb, Zr and Ti) in resulting mixture becomes within a desired ratio shown by the general formula (1). The mixture has an average particle diameter of preferably 1 μm or less, more preferably 0.5 μm or less in the point that they can easily be uniformly mixed.

The resulting mixed raw material is calcined at 750 to 1,300° C. to obtain a piezoelectric ceramic composition. At this time, the calcined piezoelectric ceramic composition has a ratio of a strength of the strongest diffraction ray of a perovskite phase to a strength of the strongest diffraction ray of a pyrochlore phase is preferably 5% or less, more preferably 2% or less.

Then, the piezoelectric ceramic composition obtained above is ground with a grinding apparatus such as a ball mill, an attrition mill, or a beads mill to give a piezoelectric material powder having a desired particle diameter. At this time, the average particle diameter of the piezoelectric material powder is preferably 0.1–1.0 μm, more preferably 0.3–0.7 μm. In addition, the maximum particle diameter of the piezoelectric material powder is preferably 3.0 μm or less, and more preferably 2.0 μm or less. By such a particle diameter, a desired ternary system solid solution composition having an average particle diameter of 1–10 μm with a maximum particle diameter being 5 times as large as the average particle diameter or less.

Incidentally, a particle diameter of the powder may be adjusted by subjecting the piezoelectric material powder obtained by grinding to a heat treatment at 400–750° C. At this time, a finer particle is more preferable because a fine particle can be integrated with other particles to give a powder having an even particle diameter. The piezoelectric material may be prepared by another method, for example, an alkoxide method or a co-precipitation method.

The method for superposing the obtained piezoelectric material may be, for example, screen printing, spraying or dipping. Of these, screen printing is preferred because it enables continuous lamination easily in a shape and thickness of high accuracy.

In the case of solidly attaching a piezoelectric portion directly onto a substrate, a piezoelectric material is superposed directly on a substrate. In the case of solidly attaching a piezoelectric portion onto a substrate via an electrode, an electrode is formed on a substrate, and a piezoelectric material is superposed on the electrode.

As the method for coating the piezoelectric material, there can be mentioned, for example, an ion beam method, sputtering, vacuum deposition, PVD, ion plating, CVD, plating, screen printing, spraying and dipping. Of these, sputtering and screen printing are preferred in view of the bondability between a ceramic substrate and a piezoelectric portion.

The formed electrode can be integrated with a substrate and/or a piezoelectric portion by a heat treatment of at about 1000–1400° C. At this time, the heat treatment may be conducted before a piezoelectric material is superposed, at the time when an electrode is formed, or collectively by a beat treatment conducted after a piezoelectric material is superposed as described below.

Next, in a production method of the present invention, the piezoelectric material superposed on the ceramic substrate or on the electrode is heat-treated in the co-presence of an atmosphere-controlling material having the same composition as the piezoelectric composition in a sealing atmosphere.

Thereby, it becomes possible to prevent the vaporization of each component constituting the piezoelectric material and obtain a piezoelectric portion containing each component at a desired ratio. This heat treatment enables to solidly attach the piezoelectric portion on a substrate directly or via an electrode.

In the present invention, the atmosphere-controlling material is made to coexist at preferably 0.03–0.50 mg/cm$^3$, more preferably 0.07–0.40 mg/cm³, furthermore preferably 0.10–0.30 mg/cm³ in terms of NiO amount per unit volume of a space in a container in the atmosphere.

When the amount in terms of NiO amount per unit volume of a space in a container in the atmosphere is less than 0.03 mg/cm³, a piezoelectric element is prone to have a low linearity of a flexural displacement relative to an electric field upon applying a high electric field because it is difficult to obtain a piezoelectric portion containing a desired amount of Ni. On the other hand, when the amount in terms of NiO amount per unit volume of a space in a container in the atmosphere is more than 0.50 mg/cm³, particles having NiO as the main component are excessively present in the piezoelectric portion, therefore, dielectric breakdown is apt to be caused.

Incidentally, NiO can be dispersed uniformly in a piezoelectric portion by making a NiO content of a co-existing atmosphere-controlling material the same as an piezoelectric ceramic composition constituting a piezoelectric material, and NiO can be dispersed in such a concentration gradient that the concentration of NiO becomes higher from the interface between the piezoelectric portion and the ceramic substrate towards the thickness direction of the piezoelectric portion by giving a higher concentration to a piezoelectric ceramic composition constituting a piezoelectric material. In addition, by controlling the NiO content of the composition made to be co-exist, it becomes possible to control the extent of the NiO concentration gradient in the piezoelectric obtained.

In the present invention, it is also preferable to use, as a container for housing the piezoelectric element and a setter for mounting the piezoelectric element thereon, a member obtained by subjecting the member to a heat treatment (hereinbelow sometimes referred to simply as "pretreatment") in an atmosphere where an atmosphere-controlling material having the same composition as the piezoelectric material is coexisted.

By this, there can be securely obtained a piezoelectric portion containing a desired amount of NiO and a piezoelectric element having high linearity of a flexural displacement relative to an electric field up to a high electric field region.

In addition, in the present invention, it is particularly preferable to subject a piezoelectric material to a heat treatment with using the pretreated container and setter as well as to make a specific amount of the aforementioned atmosphere-controlling material co-exist.

Such a heat treatment gives a piezoelectric portion where a ceramic composition contains particles having NiO on the surface and in the interior thereof, and a piezoelectric element having a higher linearity of a flexural displacement relative to an electric field up to a high electric field region.

Incidentally, to make the particles having NiO as the main component unevenly distributed, a heat treatment is conducted in the same manner as in the aforementioned case that NiO is present in a piezoelectric portion with a concentration gradient under conditions where the particles can be formed.

It is preferable that a material for the container and the setter in the present invention contains, as the main component, magnesium oxide, aluminum oxide, zirconium oxide, mullite, or spinel.

The pretreatment is preferably conducted at a temperature within a range of ±100° C. from a temperature for heat treating a material for a piezoelectric portion superposed on a substrate or the like so that an effect due to the pretreatment is sufficiently exhibited.

The pretreatment is conducted preferably plural times, more preferably at least 3 times to make securely present particles having NiO as the main component on the surface and in the interior of the ceramic composition.

It is preferable to conduct a plural number of heat treatments on a piezoelectric material after the pretreatment is conducted once. It is also preferable to conduct a heat treatment on the piezoelectric material once after a plurality of pretreatments are conducted. It is also preferable to conduct a plurality of heat treatments on the piezoelectric material after a plurality of pretreatments are conducted.

In the present invention, the heat treatment temperature for the piezoelectric material is preferably 1,000 to 1,400° C., more preferably 1,100 to 1,350° C.

When the temperature is less than 1,000° C., the solid attachment of the piezoelectric to the ceramic substrate may be insufficient or the density of the piezoelectric may be insufficient. When the temperature exceeds 1,400° C., the vaporization amount of Pb and Ni in the piezoelectric material is large and it may be difficult to obtain a piezoelectric having an intended composition.

In addition, the time for keeping the highest temperature of the heat treatment is preferably 10 min.-10 hours, more preferably 1 hour–4 hours.

When the time is less than 10 min., densification of a piezoelectric ceramic composition and growth of particles is prone to become insufficient, and desired properties cannot be obtained in some cases. When the time is more than 10 hours, the gross vaporization amount of Pb and Ni increases even if the atmosphere is controlled; which is prone to cause disadvantage of lowering in properties and increase in dielectric breakdown.

Though the heat treatment may be conducted before formation of an electrode in the present invention, it may be conducted after the formation collectively. Likewise, in a layered piezoelectric element, each electrode and each piezoelectric portion may be heat-treated by every formation thereof, may be heat-treated after all of them are formed, or may be heat-treated repeatedly after some of them are formed.

In the present invention, it is preferable that a polarization treatment is conducted to arrange polarization direction properly by applying an electric field more than coercive field of the piezoelectric portion of the piezoelectric element. At this time, the ratio of the capacity after polarization to the capacity before polarization is preferably 120% or more, more preferably 125% or more, in the point of an easily movable polarization structure.

The present invention is described more specifically below by way of Examples. However, the present invention is in no way restricted to these Examples.

In Examples and Comparative Examples, measurements on each piezoelectric element were conducted as follows.
(Method of Evaluation)
(1) Flexural displacement A voltage was applied to electrodes of a piezoelectric element so as to give an electric field of 3 kV/mm. The resulting flexural displacement of the piezoelectric element was measured by a laser displacement tester.

(2) Linearity of flexural displacement relative to electric field

There were measured a flexural displacement generated when a voltage was applied between the upper and the lower electrodes so as to give an electric field of 4 kV/mm and a displacement generated when a voltage was applied between the upper and the lower electrodes so as to give an electric field of 2 kV/mm. A ratio of the two values obtained by the measurements was evaluated. Incidentally, a higher linearity gives an evaluation nearer to 200%.

(3) Average particle diameter and the maximum particle diameter

A surface of a ternary system solid solution composition constituting a piezoelectric portion was measured with a scanning electron microscope. To be concrete, a line was drawn on an optional image for observation, a distance of a grain boundary across the line was defined as a particle diameter, particle diameters of 100 ternary system solid solution compositions were measured to determine the average particle diameter and the maximum particle diameter.

(4) Porosity

The piezoelectric portion of each piezoelectric element obtained in Examples and Comparative Examples was examined by a scanning electron microscope, over a range of 50 μm of each of the surface, length and width; the areal proportion of pores in each of the three visual fields was determined; and the average of the three areal proportions was calculated and taken as the porosity of the piezoelectric portion.

(5) Durability

Evaluation was made with a ratio of a flexural displacement after continuous application of a voltage to give an electric field of 4kV/mm with a frequency of 1 kHz continuously $1 \times 10^8$ times between electrodes to a flexural displacement before the continuous application. That is, durability is 100% when a flexural displacement is not changed after the continuous application, and durability is 0% when a flexural displacement becomes 0 after the continuous application.

(6) Rate of dielectric breakdown

A rate of the number of piezoelectric elements having dielectric breakdown relative to the number of whole piezoelectric elements was evaluated as a rate of dielectric breakdown in the case that a voltage was applied between electrodes so as to give an electric field of 4 kV/mm.

EXAMPLE 1

A lower electrode [1.2 mm×0.8 mm×3 μm (thickness)] composed of platinum was formed, by screen printing, on a $Y_2O_3$-stabilized $ZrO_2$ substrate [dimensions of the thin portion: 1.6 mm×1.1 mm×10 μm (thickness) with a shape of cross-section in a longitudinal direction being rectangle (a surface where a piezoelectric portion or an electrode is flat)]. They were subjected to a heat treatment at 1300° C. for two hours to integrate the lower electrode with the substrate.

Thereon was superposed a piezoelectric material [1.3 mm×0.9 mm×13 μm (thickness)] made of $Pb_{1.00}\{(Mg_{0.87}Ni_{0.13})_{1/3}Nb_{2/3}\}_{0.20}Ti_{0.43}Zr_{0.37}O_3$ having the average particle diameter of 0.45 μm and the maximum particle diameter of 1.8 μm.

Then, the substrate having a piezoelectric material superposed thereon was subjected to a heat-treatment at 1,275° C. for 2 hours in the co-presence of an atmosphere-controlling material having the same composition as the piezoelectric material at the rate of 0.15 mg/cm³ in terms of NiO per unit volume of the space in the container. The piezoelectric material after the heat treatment had a thickness of 10 μm.

At the time of the heat treatment, a container and a setter to be used was heat-treated (hereinbelow sometimes referred to as "pretreatment") once in the co-presence of an atmosphere-controlling material having the same composition as the piezoelectric material at the rate of 0.15 mg/cm³ in terms of NiO per unit volume of the space in the container to be adapted to the atmosphere. Housing in the container and mounting on the setter were performed.

Then, on the piezoelectric portion was formed, by screen printing, an upper electrode [1.2 mm×0.8 mm×0.5 μm (thickness)] composed of gold. The resulting material was heat-treated to produce a piezoelectric element.

EXAMPLE 2

A piezoelectric element was produced in the same manner as in Example 1 except that there was used a a piezoelectric material made of $Pb_{1.00}\{(Mg_{0.87}Ni_{0.13})_{1/3}Nb_{2/3}\}_{0.20}Ti_{0.43}Zr_{0.37}O_3$ having the average particle diameter of 0.51 μm and the maximum particle diameter of 5.3 μm.

(Evaluation)

A piezoelectric element of Example 1 had an average particle diameter of 2.2 μm, the maximum particle diameter of 5.9 μm, the ratio of the 4 kV/mm flexural displacement to the 2 kV/mm flexural displacement (hereinbelow sometimes referred to as "4/2 flexural displacement ratio) was 165%, which shows high linearity of a flexural displacement relative to an electric field. In addition, the flexural displacement itself was so large as 2.18 μm.

On the other hand, in the piezoelectric element of Example 2, the maximum particle diameter was 15.5 μm, which is above 5 times the average particle diameter, though the particle diameter was 2.3 μm. This piezoelectric element had a 4/2 flexural displacement ratio of 151%, which shows lower linearity of a flexural displacement relative to an electric field than a piezoelectric element in Example 1. The flexural displacement itself was 1.81 μm, which is smaller than that of a piezoelectric element in Example 1. The results are collectively shown in Table 1.

TABLE 1

|  | Average particle diameter (μm) | Maximum particle diameter (μm) | Maximum particle diameter/ Average particle diameter | 4/2 flexural displacement ratio (%) | Flexural displacement (μm) |
| --- | --- | --- | --- | --- | --- |
| Example 1 | 2.2 | 5.9 | 2.7 | 165 | 2.18 |
| Comp. Ex. 1 | 2.3 | 15.5 | 6.7 | 151 | 1.81 |

REFERENCE EXAMPLES 1 to 3

Piezoelectric elements were produced in the same manner as in Example 1 except that there were used, as piezoelectric materials, those obtained by mixing 97% by volume, 93% by volume or 85% by volume of a piezoelectric ceramic composition made of $Pb_{1.00}\{(Mg_{0.87}Ni_{0.13})_{1/3}Nb_{2/3}\}_{0.20}Ti_{0.43}Zr_{0.37}O_3$, with 3% by volume, 7% by volume or 15% by volume of a latex having particle diameters of 8 to 12 μm.

(Evaluation)

A piezoelectric element of Reference Example 3 (15% by volume of a latex is mixed in a piezoelectric material) had a porosity of 19%. At that time, the 4/2 flexural displacement ratio was 139%, and a flexural displacement itself was 1.65 μm. Likewise, a piezoelectric element of Reference Example 2 (7% by volume of a latex is mixed in a piezoelectric material) had a porosity of 10%. At that time, the 4/2 flexural displacement ratio was 151%, and a flexural displacement itself was 1.93 μm. In addition, a piezoelectric element of Reference Example 1 (3% by volume of a latex is mixed in a piezoelectric material) had a porosity of 5%. At that time, the 4/2 flexural displacement ratio was 161%, and a flexural displacement itself was 2.02 μm. From the above, it was confirmed that, as the porosity becomes smaller, the linearity of the flexural displacement to an electric field becomes higher, and the flexural displacement itself becomes larger. The results are collectively shown in Table 2.

TABLE 2

|  | Latex (vol %) | Porosity (%) | 4/2 flexural displacement ratio (%) | Flexural displacement (μm) |
|---|---|---|---|---|
| Reference Numeral 1 | 3 | 5 | 161 | 2.02 |
| Reference Numeral 2 | 7 | 10 | 151 | 1.93 |
| Reference Numeral 3 | 15 | 19 | 139 | 1.65 |

COMPARATIVE EXAMPLES 1, 2

A piezoelectric element was produced in the same manner as in Example 1 except that a piezoelectric element made of a ternary system solid solution composition having a different Ni ratio (y) as shown in Table 3.
(Evaluation)

A piezoelectric element in Example 1, which had a Ni ratio (y) of 0.13 in a composition, had a small porosity (3%), and a ratio of a flexural displacement after continuous application to a flexural displacement before continuous application was 94%, showing very excellent durability. In addition, a flexural displacement was large (2.18 μm).

In contrast, a piezoelectric element of Comparative Example 1 with a low ratio (0.03) of Ni (y) in the composition had a large porosity (13%), and a ratio of a flexural displacement after continuous application to a flexural displacement before continuous application was 89%, showing a durability inferior to a piezoelectric element of Example 1. In addition, a flexural displacement was 1.96 μm, which is smaller than that of a piezoelectric element of Examples.

In a piezoelectric element of Comparative Example 2 with a relatively high ratio (0.25) of Ni (y) in the composition, a ratio of a flexural displacement after continuous application to a flexural displacement before continuous application was 73%, showing the lowest durability, though it had a small porosity (4%). In addition, a flexural displacement was the smallest (1.83 μm). The results are collectively shown in Table 3.

EXAMPLE 3

A piezoelectric element was produced in the same manner as in Example 1 except that a piezoelectric material made of $Pb_{1.00}\{(Mg_{0.84}Ni_{0.16})_{0.97/3}Nb_{2/3}\}_{0.20}Ti_{0.43}Zr_{0.37}O_3$ was laminated.

EXAMPLE 4

A piezoelectric element was produced in the same manner as in Example 1 except that a piezoelectric material made of $Pb_{1.00}\{(Mg_{0.80}Ni_{0.20})_{0.97/3}Nb_{2/3}\})_{0.20}Ti_{0.43}Zr_{0.37}O_3$ was laminated on a piezoelectric material made of $Pb_{1.00}\{(Mg_{0.95}Ni_{0.05})_{0.97/3}Nb_{2/3}\}_{0.20} Ti_{0.43}Zr_{0.37}O_3$ laminated on an electrode unitarily joined with a $ZrO_2$ substrate.

EXAMPLE 5

A piezoelectric element was produced in the same manner as in Example 1 except that a piezoelectric material made of $Pb_{1.00}\{(Mg_{0.80}Ni_{0.20})_{0.97/3}Nb_{2/3}\}_{0.20}Ti_{0.43}Zr_{0.37}O_3$ was laminated on a piezoelectric material made of $Pb_{1.00}\{(Mg_{0.95}Ni_{0.05})_{0.97/3}Nb_{2/3}\}_{0.20} Ti_{0.43}Zr_{0.37}O_3$ laminated on an electrode unitarily joined with a $ZrO_2$ substrate and a container and a setter both subjected to a pretreatment three times upon a heat treatment.
(Evaluation)

A piezoelectric element in Example 3 had a 4/2 flexural displacement ratio of 168%, showing a relatively high linearity of a flexural displacement relative to an electric field, and a flexural displacement was large (2.22 μm). In addition, the dispersion state of NiO in a piezoelectric portion was examined by an EPMA analysis, and no particle having NiO as the main component was not observed.

On the other hand, a piezoelectric element of Example 4 had a 4/2 flexural displacement ratio of 172%, showing higher linearity of a flexural displacement relative to electric fields than that of a piezoelectric element of Example 3, and a flexural displacement was about the same. In addition, the dispersion state of NiO in a piezoelectric portion was examined by an EPMA analysis, which indicated that particles having NiO as the main component were not present in the interior of the piezoelectric portion though they were present on a surface of the piezoelectric portion. Further, it was found that Ni was dispersed in the piezoelectric ceramic composition in such a concentration gradient that the concentration of Ni becomes higher from the interface between the piezoelectric portion and the substrate towards the thickness direction of the piezoelectric portion.

A piezoelectric element of Example 5 had a 4/2 flexural displacement ratio of 177%, showing the highest linearity of a flexural displacement relative to an electric field, and a flexural displacement was about the same. In addition, the dispersion state of NiO in a piezoelectric portion was examined by an EPMA analysis, which indicated that par-

TABLE 3

|  | Piezoelectric Material | Porosity (%) | Durability (%) | Flexural Displacement (μm) |
|---|---|---|---|---|
| Example 1 | $Pb_{1.00}\{(Mg_{0.87}Ni_{0.13})_{1/3}Nb_{2/3}\}_{0.20}Ti_{0.43}Zr_{0.37}O_3$ | 3 | 94 | 2.18 |
| Comp. Ex. 1 | $Pb_{1.00}\{(Mg_{0.97}Ni_{0.03})_{1/3}Nb_{2/3}\}_{0.20}Ti_{0.43}Zr_{0.37}O_3$ | 13 | 89 | 1.96 |
| Comp. Ex. 2 | $Pb_{1.00}\{(Mg_{0.75}Ni_{0.25})_{1/3}Nb_{2/3}\}_{0.20}Ti_{0.43}Zr_{0.37}O_3$ | 4 | 73 | 1.83 | ticles having NiO as the main component were present both on a surface and in the interior of the piezoelectric portion. In addition, Mg was detected. The results are collectively shown in Table 4.

TABLE 4

| | Presence of particles having NiO as main component | Presence of Mg in particle having NiO as main component | 4/2 flexural displacement ratio (%) | Flexural displacement (μm) |
|---|---|---|---|---|
| Example 3 | None | None | 168 | 2.22 |
| Example 4 | Present in the interior | None | 172 | 2.17 |
| Example 5 | Present in the interior and on the surface | Detected | 177 | 2.19 |

EXAMPLE 6 AND COMPARATIVE EXAMPLE 3, 4

A piezoelectric element was produced in the same manner as in Example 1 except that a piezoelectric material having a composition shown in Table 5 was used.

(Evaluation)

A piezoelectric element of Example 6, where a total ratio of Mg and Ni in a piezoelectric material is within the range ($a=0.97$), had a 4/2 flexural displacement ratio of 170%, showing high linearity of a flexural displacement relative to an electric field, and a flexural displacement itself was large (2.25 μm).

On the other hand, a piezoelectric element of Comparative Example 3 having a small total ratio ($a=0.85$) of Mg and Ni in a piezoelectric ceramic composition has a 4/2 flexural displacement ratio of 143%, showing a low linearity of a flexural displacement relative to an electric field, and a flexural displacement was small (1.76 μm). In Comparative Example 4 having a high total ratio of Mg and Ni ($a=1.15$) in a piezoelectric ceramic composition, a 4/2 flexural displacement ratio was 137%, showing the lowest linearity of a flexural displacement relative to an electric field, and a flexural displacement itself was the smallest (1.59 μm). The results are collectively shown in Table

TABLE 5

| | Example 6 | Comp. Ex. 3 | Comp. Ex. 4 |
|---|---|---|---|
| $Pb_x\{(Mg_{1-y}Ni_y)_{1/3xa}Nb_{2/3}\}_bTi_cZr_dO_3$ | | | |
| Pb-substituent | | | |
| Sort of element | Ba, La | Ba, La | Ba, La |
| ratio (mol %) | 4.0, 0.8 | 4.0, 0.8 | 4.0, 0.8 |
| x | 1.00 | 1.00 | 1.00 |
| y | 0.13 | 0.13 | 0.13 |
| a | 0.97 | 0.85 | 1.15 |
| b | 0.370 | 0.370 | 0.370 |
| c | 0.380 | 0.380 | 0.380 |
| d | 0.250 | 0.250 | 0.250 |
| 4/2 flexural displacement ratio (%) | 170 | 143 | 137 |
| Flexural displacement (μm) | 2.25 | 1.76 | 1.59 |

EXAMPLE 7 AND COMPARATIVE EXAMPLE 5

A piezoelectric element was produced in the same manner as in Example 1 except that a piezoelectric material having a composition shown in Table 6 was used.

(Evaluation)

A piezoelectric element of Example 7 having a Pb content in a piezoelectric material within the range ($x=0.98$) of the present invention has a 4/2 flexural displacement ratio of 162%, showing high linearity of a flexural displacement relative to an electric field, and a flexural displacement itself was large (2.05 μm).

On the other hand, a piezoelectric element of Comparative Example 5 having a low Pb content ($x=0.93$) in a piezoelectric element has a 4/2 flexural displacement ratio of 146%, showing low linearity of a flexural displacement relative to an electric field, and a flexural displacement itself was small (1.72 μm). The results are collectively shown in Table 6.

TABLE 6

| | Example 7 | Com. Ex. 5 |
|---|---|---|
| $Pb_x\{(Mg_{1-y}Ni_y)_{1/3xa}Nb_{2/3}\}_bTi_cZr_dO_3$ | | |
| Pb-substituent | None | None |
| x | 0.98 | 0.93 |
| y | 0.13 | 0.13 |
| a | 0.97 | 0.97 |
| b | 0.375 | 0.375 |
| c | 0.375 | 0.375 |
| d | 0.250 | 0.250 |
| 4/2 flexural displacement ratio (%) | 162 | 146 |
| Flexural displacement (μm) | 2.05 | 1.72 |

EXAMPLE 8–11

A piezoelectric element was produced in the same manner as in Example 1 except that a piezoelectric material having a composition shown in Table 7 was used.

(Evaluation)

Any of the piezoelectric elements in Examples 8–11 had a 4/2 flexural displacement ratio of 160% or more, showing relatively high linearity of flexural displacement relative to an electric field, and a flexural displacement was large (2.19 μm or more).

However, a piezoelectric element of Example 9 employing a piezoelectric material having a composition where 5.0 mol % of Pb was substituted by Sr and a piezoelectric element of Example 10 employing a piezoelectric material having a composition where 10.0 mol % of Pb was substituted by Ba had a 4/2 flexural displacement ratio of 169% and 166%, respectively, showing higher linearity of a flexural displacement relative to an electric field in comparison with a piezoelectric element of Example 8 employing a piezoelectric material having a composition where Pb is not substituted at all.

On the other hand, a piezoelectric element of Example 11 employing a piezoelectric material where 7.5 mol % of Pb was substituted by Sr, and other 7.5 mol % of Pb was substituted by Ca (15 mol % in total) had a 4/2 flexural displacement ratio of 160%, showing lower linearity of a flexural displacement relative to an electric field in comparison with a piezoelectric element of Example 8 employing a piezoelectric material having a composition where Pb is not substituted at all. The results are collectively shown in Table 7.

TABLE 7

|  | Example 8 | Example 9 | Example 10 | Example 11 |
|---|---|---|---|---|
| $Pb_x\{(Mg_{1-y}Ni_y)_{1/3\times a}Nb_{2/3}\}_bTi_cZr_dO_3$ | | | | |
| Pb-substituent | | | | |
| Sort of element | None | Sr | Ba | Ba, Ca |
| ratio (mol %) | — | 5.0 | 10.0 | 7.5, 7.5 |
| x | 1.00 | 1.00 | 1.00 | 1.00 |
| y | 0.13 | 0.13 | 0.13 | 0.13 |
| a | 0.97 | 0.97 | 0.97 | 0.97 |
| b | 0.375 | 0.375 | 0.375 | 0.375 |
| c | 0.375 | 0.375 | 0.375 | 0.375 |
| d | 0.250 | 0.250 | 0.250 | 0.250 |
| 4/2 flexural displacement ratio (%) | 164 | 169 | 166 | 160 |
| Flexural displacement (μm) | 2.26 | 2.33 | 2.30 | 2.19 |

EXAMPLES 12, 13

A piezoelectric element was produced in the same manner as in Example 1 except that a piezoelectric material having a composition shown in Table 8 was used.

(Evaluation)

Any of the piezoelectric elements in Examples 12 and 13 had a 4/2 flexural displacement ratio of 161% or more, showing relatively high linearity of a flexural displacement relative to an electric field.

However, a piezoelectric element of Example 12 employing a piezoelectric material where 0.8 mol % of Pb is substituted by La had a 4/2 flexural displacement ratio of 167%, showing higher linearity of a flexural displacement relative to an electric field in comparison with that of a piezoelectric element of Example 8 employing a piezoelectric material where a part of Pb was not substituted by La. In addition, the flexural displacement itself was larger (2.30 μm).

On the other hand, a piezoelectric element of Example 13 employing a piezoelectric material where 1.5 mol % of Pb is substituted by La had a 4/2 flexural displacement ratio of 161%, showing lower linearity of a flexural displacement relative to an electric field in comparison with that of a piezoelectric element of Example 8. In addition, the flexural displacement itself was small (2.18 μm) in comparison with that of the piezoelectric element in Example 11. The results are shown in Table 8.

TABLE 8

|  | Example 8 | Example 12 | Example 13 |
|---|---|---|---|
| $Pb_1\{(Mg_{1-y}Ni_y)_{1/3\times a}Nb_{2/3}\}_bTi_cZr_dO_3$ | | | |
| Pb substituent | | | |
| Sort of element | None | La | La |
| ratio (mol %) | — | 0.8 | 1.5 |
| x | 1.00 | 1.00 | 1.00 |
| y | 0.13 | 0.13 | 0.13 |
| a | 0.97 | 0.97 | 0.97 |
| b | 0.375 | 0.375 | 0.375 |
| c | 0.375 | 0.375 | 0.375 |
| d | 0.250 | 0.250 | 0.250 |

TABLE 8-continued

|  | Example 8 | Example 12 | Example 13 |
|---|---|---|---|
| 4/2 flexural displacement ratio (%) | 164 | 167 | 161 |
| Flexural displacement (μm) | 2.26 | 2.30 | 2.18 |

EXAMPLE 14, COMPARATIVE EXAMPLES 6, 7

A piezoelectric element was produced in the same manner as in Example 1 except that a piezoelectric material made of $Pb_{1.00}\{(Mg_{0.90}Ni_{0.10})_{1/3}Nb_{2/3}\}_{0.20}Ti_{0.43}Zr_{0.37}O_3$ was laminated, that a heat treatment was conducted in the co-presence of an atmosphere-controlling material at 0.15 mg/cm³, 0.750 mg/cm³, 0.015 mg/cm³, respectively, in terms of NiO amount per unit volume of a space in a container, and that a container and a setter without being subjected to a pretreatment were used.

(Evaluation)

In Example 4, where the heat treatment was conducted in the co-presence of 0.15 mg/cm³ of an atmosphere-controlling material in terms of a NiO amount per unit volume of a space in a container, the 4/2 flexural displacement ratio was 167%, showing high linearity of a flexural displacement.

A piezoelectric element of Comparative Example 6, where a heat treatment was conducted in the co-presence of an atmosphere-controlling material at the rate of 0.750 mg/cm³ in terms of NiO amount per unit volume of a space in a container, had a relatively high linearity of a flexural displacement (164% of a 4/2 flexural displacement ratio) and a relatively large flexural displacement (2.01 μm). However, a dielectric breakdown ratio was high (15%). A piezoelectric element of Comparative Example 7, where a heat treatment was conducted in the co-presence of an atmosphere-controlling material at the rate of 0.015 mg/cm³ in terms of NiO amount per unit volume of a space in a container, had a low 4/2 flexural displacement ratio (144%) and the lowest linearity of a flexural displacement, and a flexural displacement itself was the smallest (1.58 μm). The results are collectively shown in Table 9.

TABLE 9

| | Atmosphere-controlling material ... NiO conversion amount per unit unit volume (mg/cm³) | Dielectric breakdown ratio (%) | 4/2 flexural displacement ratio (%) | Flexural displacement (μm) |
|---|---|---|---|---|
| Example 14 | 0.150 | 2 | 167 | 2.29 |
| Comp. Ex. 6 | 0.750 | 15 | 164 | 2.01 |
| Comp. Ex. 7 | 0.015 | 2 | 144 | 1.58 |

EXAMPLE 15

A piezoelectric element was produced in the same manner as in Example 1 except that a substrate having a W-like sectional shape in a thickness direction was used and that a piezoelectric material made of $Pb_{1.00}\{(Mg_{0.90}Ni_{0.10})_{1/3}Nb_{2/3}\}_{0.20}Ti_{0.43}Zr_{0.37}O_3$ was used.

EXAMPLE 16

A piezoelectric element was produced in the same manner as in Example 1 except that a piezoelectric material made of $Pb_{1.00}\{(Mg_{0.90}Ni_{0.10})_{1/3}Nb_{2/3}\}_{0.20}Ti_{0.43}Zr_{0.37}O_3$ was used. Incidentally, a sectional shape of a substrate in a thickness direction was rectangular (having a flat plane where a piezoelectric portion and an electrode are solidly attached) as in Example 1.

(Evaluation)

A piezoelectric element of Example 15, where a substrate a W-like sectional shape in a thickness direction was used, had a higher linearity of a flexural displacement relative to an electric field (173% of a 4/2 flexural displacement ratio) than that of a piezoelectric element of Example 16, where a substrate having a rectangle sectional shape in a thickness direction (a plane where a piezoelectric portion or an electrode is solidly attached is flat). In addition, a flexural displacement itself was larger (2.49 μm) in comparison with a piezoelectric element of Example 16.

TABLE 10

| | Sectional shape of substrate | 4/2 flexural displacement ratio (%) | flexural displacement (μm) |
|---|---|---|---|
| Example 15 | W-like shape | 173 | 2.49 |
| Example 16 | Rectangular (flat) | 166 | 2.31 |

EXAMPLE 17

A piezoelectric element was produced in the same manner as in Example 1 except that there was used a layered piezoelectric element having a negative electrode, a piezoelectric material, a positive electrode, a piezoelectric material and negative electrode superposed on a substrate in this order, and having a negative electrode and a positive electrode alternatively interposed between two piezoelectric portions with the bottom piezoelectric portion being solidly adhered to the substrate via an electrode, and that a thickness of layered material was made half of that of Example 1 to make a thickness of each piezoelectric portion to be 5 μm (10 μm as a whole as in Example 1).

(Evaluation)

A piezoelectric element of Example 1 having only one layer in the piezoelectric portion had a large 4/2 flexural displacement ratio of 165%, showing high linearity of a flexural potential relative to an electric field. On the other hand, a piezoelectric element of Example 17 having each piezoelectric portion having a half thickness and two layers had a 4/2 flexural displacement ratio of 161%, showing lower linearity of a flexural potential to an electric field that a piezoelectric element of Example 1. However, a flexural displacement itself was larger (2.30 μm) than a piezoelectric element of Example 1. The results are collectively shown in Table 11.

TABLE 11

| | Thickness of piezoelectric portion (μm) | Number of layers in piezoelectric portion | 4/2 flexural displacement ratio (%) | Flexural displacement (μm) |
|---|---|---|---|---|
| Example 1 | 10 | 1 | 165 | 2.18 |
| Example 17 | 5 | 2 | 161 | 2.30 |

As described above, according to the present invention, there can be provided a piezoelectric element which has very high piezoelectric properties, excellent vibration transmittability between a ceramic substrate and a piezoelectric portion, high linearity of a flexural displacement relative to an electric field, and a high durability even in the use for a long period of time with a large flexural displacement, and a method for production thereof. The piezoelectric element of the present invention can be suitably used for an actuator, a sensor, etc.

What is claimed is:

1. A piezoelectric element comprising:
    a ceramic substrate,
    a piezoelectric portion made of a piezoelectric ceramic composition containing a $Pb(Mg, Ni)_{1/3}Nb_{2/3}O_3$—$PbZrO_3$—$PbTiO_3$ ternary system solid solution composition being represented by the following general formula (1) as a main component, and
    an electrode;
    wherein said electrode is electrically connected to said piezoelectric portion, and said piezoelectric portion is solidly attached to the ceramic substrate directly or via said electrode;

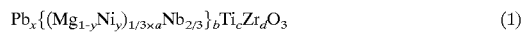
$$Pb_x\{(Mg_{1-y}Ni_y)_{1/3\times a}Nb_{2/3}\}_bTi_cZr_dO_3 \qquad (1)$$

wherein $0.95 \leq x \leq 1.05$; $0.05 \leq y \leq 0.20$; $0.90 \leq a \leq 1.10$; b, c and d are decimals falling in a range surrounded by (b,c, d)=(0.550, 0.425, 0.025), (0.550, 0,325, 0.125), (0.375, 0.325, 0.300), (0.100, 0.425, 0.475), (0.100, 0.475, 0.425) and (0.375, 0.425, 0.200) in the coordinates with coordinate axes of said b, c and d, and b+c+d=1.000.

2. A piezoelectric element according to claim 1, wherein said ternary system solid solution composition has an average particle diameter of 1–10 μm with a maximum particle diameter being 5 times as large as the average particle diameter or less.

3. A piezoelectric element according to claim 1, wherein Ni is dispersed in said piezoelectric ceramic composition in such a concentration gradient that the concentration of Ni becomes higher from the interface between said piezoelectric portion and said substrate towards the thickness direction of the piezoelectric portion.

4. A piezoelectric element according to claim 1, wherein Pb in said piezoelectric ceramic composition is replaced by at least one kind of element selected from the group consisting of Sr, Ca and Ba, by 2 to 10 mole % in the whole Pb.

5. A piezoelectric element according to claim 1, wherein Pb in said piezoelectric ceramic composition is replaced by La by 0.2–1.0 mole % in the whole Pb.

6. A piezoelectric element according to claim 1, wherein said piezoelectric portion has a thickness of 1 to 300 μm.

7. A piezoelectric element according to claim 1, wherein said substrate has a thickness of 3 μm to 1 mm.

8. A piezoelectric element according to claim 1, wherein the ratio of the thickness of the substrate to the thickness of the piezoelectric portion (the thickness of the substrate/the thickness of the piezoelectric portion) is 0.1 to 30.

9. A piezoelectric element according to claim 1, wherein a cross-section of said substrate in the thickness direction has a W-like shape having three inflection points.

10. A piezoelectric element comprising:
a ceramic substrate,
a plurality of piezoelectric portions made of a piezoelectric ceramic composition containing a Pb(Mg, Ni)$_{1/3}$Nb$_{2/3}$O$_3$—PbZrO$_3$—PbTiO$_3$ ternary system solid solution composition represented by the following general formula (1) as a main component, and a plurality of electrodes;
wherein said plurality of piezoelectric portions are laminated with interposing negative electrodes and positive electrodes of said electrodes alternately in each gap between said piezoeleciric portions and a lowermost piezoelectric portion is solidly attached to the ceramic substrate directly or via said electrode;

$$Pb_x\{(Mg_{1-y}Ni_y)_{1/3 \times a}Nb_{2/3}\}_b Ti_c Zr_d O_3 \quad (1)$$

wherein 0.95≦x≦1.05; 0.05≦y≦0.20; 0.90≦a≦1.10; b, c and d are decimals falling in a range surrounded by (b,c,d) (0.550, 0.425, 0.025), (0.550, 0.325, 0.125), (0.375, 0.325, 0.300), (0.100, 0.425, 0.475), (0.100, 0.475, 0.425) and (0.375, 0.425, 0.200), in the coordinates with coordinate axes of said b, c and d, and b+c+d=1.000.

11. A piezoelectric element according to claim 10, wherein said ternary system solid solution composition has an average particle diameter of 1–10 μm with a maximum particle diameter being 5 times as large as the average particle diameter or less.

12. A piezoelectric element according to claim 10, wherein Ni is dispersed in said piezoelectric ceramic composition in such a concentration gradient that the concentration of Ni becomes higher from the interface between said piezoelectric portions and said substrate towards the thickness direction of the piezoelectric portions.

13. A piezoelectric element according to claim 10, wherein Pb in said piezoelectric ceramic composition is replaced by at least one kind of element selected from the group consisting of Sr, Ca and Ba, by 2 to 10 mole % in the whole Pb.

14. A piezoelectric element according to claim 10, wherein Pb in said piezoelectric ceramic composition is replaced by La by 0.2–1.0 mole % in the whole Pb.

15. A piezoelectric element according to claim 10, wherein said piezoelectric portions have a thickness of 1 to 300 μm.

16. A piezoelectric element according to claim 10, wherein said substrate has a thickness of 3 μm to 1 mm.

17. A piezoelectric element according to claim 10, wherein the ratio of the thickness of the substrate to the thickness of the piezoelectric portions (the thickness of the substrate/the thickness of the piezoelectric portions) is 0.1 to 30.

18. A piezoelectric element according to claim 10, wherein a cross-section of said substrate in the thickness direction has a W-like shape having three inflection points.

19. A piezoelectric element comprising:
a ceramic substrate,
a piezoelectric portion made of a piezoelectric ceramic composition containing a Pb(Mg, Ni)$_{1/3}$Nb$_{2/3}$O$_3$—PbZrO$_3$—PbTiO$_3$ ternary system solid solution composition represented by the following general formula (1) as a main component, and said piezoelectric ceramic composition contain particles having NiO as a main component on the surface and/or in the interior thereof, and
an electrode;
wherein said electrode is electrically connected to said piezoelectric portion, and said piezoelectric portion is solidly attached to the ceramic substrate directly or via said electrode;

$$Pb_x\{(Mg_{1-y}Ni_y)_{1/3}Nb_{2/3}\}_b Ti_c Zr_d O_3 \quad (1)$$

wherein 0.95≦x≦1.05; 0.05≦y≦0.20; 0.90≦a≦1.10; b, c and d are decimals falling in a range surrounded by (b,c, d)=(0.550, 0.425, 0.025), (0.550, 0.325, 0.125), (0.375, 0.325, 0.300), (0.100, 0.425, 0.475), (0.100, 0.475, 0.425) and (0.375, 0.425, 0.200), in the coordinates with coordinate axes of said b, c and d, and b+c+d=1.000.

20. A piezoelectric element according to claim 19, wherein said ternary system solid solution composition has an average particle diameter of 1–10 μm with a maximum particle diameter being 5 times as large as the average particle diameter or less.

21. A piezoelectric clement according to claim 19, wherein said particles having NiO as a main component contain a solid solution of NiO and MgO.

22. A piezoelectric element according to claim 19, wherein Ni is dispersed in said piezoelectric ceramic composition in such a concentration gradient that the concentration of Ni becomes higher from the interface between said piezoelectric portion and said substrate towards the thickness direction of the piezoelectric portion.

23. A piezoelectric element according to claim 19, wherein Pb in said piezoelectric ceramic composition is replaced by at least one kind of element selected from the group consisting of Sr, Ca and Ba, by 2 to 10 mole % in the whole Pb.

24. A piezoelectric element according to claim 19, wherein Pb in said piezoelectric ceramic composition is replaced by La by 0.2–1.0 mole % in the whole Pb.

25. A piezoelectric element according to claim 19, wherein said piezoelectric portion has a thickness of 1 to 300 μm.

26. A piezoelectric element according to claim 19, wherein said substrate has a thickness of 3 μm to 1 mm.

27. A piezoelectric element according to claim 19, wherein the ratio of the thickness of the substrate to the thickness of the piezoelectric portion (the thickness of the substrate/the thickness of the piezoelectric portion) is 0.1 to 30.

28. A piezoelectric element according to claim 19, wherein a cross-section of said substrate in the thickness direction has a W-like shape having three inflection points.

* * * * *